(12) United States Patent
Williams et al.

(10) Patent No.: US 8,975,783 B2
(45) Date of Patent: Mar. 10, 2015

(54) DUAL-LOOP DYNAMIC FAST-TRACKING MPPT CONTROL METHOD, DEVICE, AND SYSTEM

(75) Inventors: Bertrand J. Williams, Austin, TX (US); Sam B. Sandbote, Austin, TX (US)

(73) Assignee: Draker, Inc., Austin, TX (US)

(*) Notice: Subject to any disclaimer, the term of this patent is extended or adjusted under 35 U.S.C. 154(b) by 1086 days.

(21) Appl. No.: 13/010,280

(22) Filed: Jan. 20, 2011

(65) Prior Publication Data
US 2011/0175454 A1 Jul. 21, 2011

Related U.S. Application Data

(60) Provisional application No. 61/296,797, filed on Jan. 20, 2010, provisional application No. 61/301,197, filed on Feb. 3, 2010.

(51) Int. Cl.
| H02J 1/00 | (2006.01) |
|---|---|
| H02J 3/00 | (2006.01) |
| G05F 1/67 | (2006.01) |
| H01L 31/02 | (2006.01) |
| H02J 3/38 | (2006.01) |

(52) U.S. Cl.
CPC ............ *G05F 1/67* (2013.01); *H01L 31/02021* (2013.01); *H02J 3/385* (2013.01); *Y02E 10/58* (2013.01)
USPC .......................................................... 307/82

(58) Field of Classification Search
CPC .......... H02J 3/385; H02J 3/382; Y02E 10/58; G05F 1/67; H01L 31/02021
USPC .......................................................... 307/82
See application file for complete search history.

(56) References Cited

U.S. PATENT DOCUMENTS

| 7,158,395 B2 | 1/2007 | Deng et al. |
|---|---|---|
| 7,768,155 B2 | 8/2010 | Fornage |
| 7,859,241 B2 | 12/2010 | Yoshida et al. |

(Continued)

OTHER PUBLICATIONS

"Maximum power point tracker," Wikipedia, the free encyclopedia, http://en.wikipedia.org/wiki/Maximum_power_point_tracker, 2 pages (Retrieved Nov. 17, 2008).

(Continued)

*Primary Examiner* — Carlos Amaya
(74) *Attorney, Agent, or Firm* — Meyertons Hood Kivlin Kowert & Goetzel, P.C.; Jeffrey C. Hood (57) ABSTRACT

A converter unit to improve the response dynamics and overall recovered power in a photovoltaic array configuration. Each photovoltaic panel in the photovoltaic array may be coupled to a respective converter unit, which may include a controller to sense an output voltage and output current produced by the solar panel, and control operation of a power converter to output modified voltage and current corresponding to the solar panel onto a bus coupling the converter units. The controller may operate as an analog or (digital) firmware control system to regulate the input voltage of each power converter unit under indirect guidance of a Maximum Power Point Tracking (MPPT) controller to optimize and regulate the resultant power, and achieve very fast dynamic response to environmental transients. Input voltage and output voltage management may be achieved by way of a fast inner control loop and a corresponding MPPT control system configured as an outer guidance loop providing a reference signal to the inner control loop.

23 Claims, 4 Drawing Sheets

(56) References Cited

U.S. PATENT DOCUMENTS

| | | |
|---|---|---|
| 2007/0221267 A1 | 9/2007 | Fornage |
| 2008/0143188 A1* | 6/2008 | Adest et al. .................... 307/82 |
| 2008/0150366 A1 | 6/2008 | Adest et al. |
| 2008/0203994 A1 | 8/2008 | Park |
| 2009/0160258 A1 | 6/2009 | Allen et al. |
| 2009/0189574 A1 | 7/2009 | Le et al. |
| 2009/0284240 A1* | 11/2009 | Zhang et al. ................ 323/285 |

OTHER PUBLICATIONS

"New Solar Panels," Solar Power, http://www.otherpower.com/otherpower_solar_new.html, 4 pages (Retrieved Nov. 17, 2008).

Kasemsan Siri and Kenneth A. Conner, "Sequentially Controlled Distributed Solar-Array Power System with Maximum Power Tracking," IEEEAC paper #1001, Version 3, Updated Sep. 30, 2003, 9 pages.

Kasemsan Siri and Kenneth A. Conner, "Parallel-Connected Converters with Maximum Power Tracking," The Aerospace Corporation, Electrical and Electronic systems Department, 2002, 7 pages.

Yan Hong Lim and D.C. Hamill, "Simple maximum power point tracker for photovoltaic arrays," Electronic Letters, vol. 36, No. 11, May 25, 2000, 2 pages.

Windy Dankoff, "Increase Solar Charging with an MMPT Power Tracking Charge Controller," What is MPPT? Explanation of maximum power point tracking, http://www.wholesalesolar.com/Wind/MPPT-article.html, 2 pages. (Retrieved Nov. 17, 2008).

W. Stephen Woodward, "Maximum-Power-Point-Tracking Solar Battery Charger," Electronic Design, Sep. 14, 1998, pp. 114-118.

* cited by examiner

DUAL-LOOP DYNAMIC FAST-TRACKING MPPT CONTROL METHOD, DEVICE, AND SYSTEM

PRIORITY CLAIM AND INCORPORATION BY REFERENCE

This application claims benefit of priority of U.S. Provisional Application Ser. No. 61/296,797 titled "Dual-Loop Dynamic Fast-Tracking MPPT Control Method, Device, and System", filed Jan. 20, 2010, and whose inventors are Bertrand J. Williams and Sam B. Sandbote, and which is hereby incorporated by reference in its entirety as though fully and completely set forth herein.

This application further claims benefit of priority of U.S. Provisional Application Ser. No. 61/301,197 titled "System and Method for Constraint Weighted Regulation of a DC/DC Converter for Solar Array Applications", filed Feb. 3, 2010, and whose inventors are Bertrand J. Williams and Sam B. Sandbote, and which is hereby incorporated by reference in its entirety as though fully and completely set forth herein.

This application also incorporates by reference U.S. patent application Ser. No. 12/314,050 titled "Solar Power Array with Maximized Panel Power Extraction", filed Dec. 3, 2008, and whose inventors are Bertrand J. Williams and Brett A. Raymis, and which is hereby incorporated by reference in its entirety as though fully and completely set forth herein.

BACKGROUND OF THE INVENTION

1. Field of the Invention

This invention relates generally to the field of solar panels and solar panel array systems, and more particularly to the design, application, and use of DC/DC converter modules with solar panels to improve power recovery in the solar array.

2. Description of the Related Art

Photovoltaic arrays (more commonly known and referred to as solar arrays) are a linked collection of solar panels, which typically consist of multiple interconnected solar cells. The modularity of solar panels facilitates the configuration of solar (panel) arrays to supply current to a wide variety of different loads. The solar cells convert solar energy into direct current electricity via the photovoltaic effect, in which electrons in the solar cells are transferred between different bands (i.e. from the valence to conduction bands) within the material of the solar cell upon exposure to radiation of sufficient energy, resulting in the buildup of a voltage between two electrodes. The power produced by a single solar panel is rarely sufficient to meet the most common power requirements (e.g. in a home or business setting), which is why the panels are linked together to form an array. Most solar arrays use an inverter to convert the DC power produced by the linked panels into alternating current that can be used to power lights, motors, and other loads.

The various designs proposed and developed for solar arrays typically fall into one of two configurations: a low-voltage configuration (when the required nominal voltage is not that high), and a high-voltage configuration (when a high nominal voltage is required). The first configuration features arrays in which the solar panels are parallel-connected. The second configuration features solar panels first connected in series to obtain the desired high DC voltage, with the individual strings of series-connected panels connected in parallel to allow the system to produce more current. Various problems have been associated with both configurations, with the most prolific array configuration being the high-voltage series-string based configuration. The series-string configuration raises the overall distribution DC-bus voltage level to reduce resistive losses. However, in doing so it increases panel mismatch losses by virtue of the series-string being limited by the weakest panel in the string. In addition, the resultant DC-bus voltage has a significant temperature and load variance that makes inversion from DC to AC more difficult. Consequently, many design efforts have been concentrated on improving the efficiency of the collection of electrical power from the array, by mitigating these non-idealities.

Various designs have been proposed and developed for DC/DC (DC-to-DC) converter systems applied to solar arrays. Most of these designs have concentrated on the implementation of Maximum Power Point Tracking (MPPT), which employs a high efficiency DC/DC converter that presents an optimal electrical load to a solar panel or array, and produces a voltage suitable for the powered load. MPPT converters directly control the voltage and current conversion within the DC/DC converter unit. These systems are therefore often restricted to a relatively slow dynamic response, while there is still a need to perform fast power calculations requiring a fast hardware multiplication. Furthermore, with direct MPPT control of the DC/DC converter, the ability to precisely manage the input and output port voltages is easily compromised.

Many other problems and disadvantages of the prior art will become apparent to one skilled in the art after comparing such prior art with the present invention as described herein.

SUMMARY OF THE INVENTION

In one set of embodiments, a control system or controller may be designed to improve the response dynamics and overall recovered power from a string plus branch or fully parallel-coupled solar array configuration. Each solar panel in the solar array may be coupled to a respective controller, which may sense an output voltage and output current produced by the solar panel, and control operation of a power converter (e.g. a DC/DC switching power converter) to output modified voltage and current corresponding to the solar panel into the series string, or into the parallel-connected configuration (an example of which is also provided in U.S. patent application Ser. No. 12/314,050, fully incorporated herein by reference). The controllers may be retrofitted with ease into existing solar arrays that include solar panels connected in series or in parallel. In one set of embodiments, the controller may include a hardware controller driven by analog or (digital) firmware control systems to regulate the input voltage of each power converter unit under indirect guidance of a Maximum Power Point Tracking (MPPT) controller to optimize and regulate the resultant power and achieve very fast dynamic response to environmental transients. In one set of embodiments, input voltage and output voltage management may both be achieved by way of an inner control loop and a corresponding MPPT control system configured as an outer guidance loop. Consequently, solar panel arrays may achieve faster response times to transient events on the power bus that may affect the output and input of the power regulators, thus achieving higher power transfer and recovery levels than traditional MPPT-only based systems.

In most current systems, a control signal (e.g. PWM/Pulse Width Modulated/signal) of switching power converters that are coupled to the solar panels is controlled directly, i.e. parameters indicative of the input and output current and voltage associated with the power converter are used directly to control the duty cycle (value) of the PWM signal in a single loop. In contrast, various embodiments of a novel controller may include an inner loop that controls the duty cycle by monitoring a subset of the parameters (e.g. monitoring input voltage), and very rapidly maintaining desired current and voltage values/levels based on the subset of the parameters. A slower outer loop responsible for performing MPPT may control the reference point to which the inner loop may be regulating. The inner loop may monitor one or more of the inputs (e.g. input-port voltage, input-port current, output-port voltage, or output-port current, referring to ports of the power converter) to perform a regulation function associated with that input. While any one or more of these ports may be monitored, in many embodiments it is sufficient to monitor only one of these ports. For example the inner loop may monitor the input-port voltage, for performing an input voltage regulation function. The dual-loop configuration may thus successfully prevent transients at the output ports from being tracked to the input ports by implementing a sufficiently high bandwidth in the input-port regulating inner loop. To put it another way, the inner loop may rapidly respond to the transients on an output port to hold the input port at a desired (substantially fixed) point, whereas in the single loop configuration (with a slow response) the input port typically tracks the output port during transients, resulting in the input port deviating from its desired value, requiring time to potentially regulate the input port back to its desired state. To put it yet another way, by rapidly adapting the corresponding control signal (in this case a PWM signal) to adjust the input port to return to a desired operating point, the input port becomes desensitized to output modulations.

For example the output port of the power converter coupled to the solar panel may be affected by the DC/AC inverter coupled to the DC bus to which the power converters associated with the solar panels are also coupled. The DC/AC inverter may include a single-stage inverter @60 Hz, and may impress a 120 Hz power waveform onto the DC bus. This 120 Hz power waveform may then get superimposed onto the solar panel. However, by providing an inner control loop having a bandwidth that is faster than 120 Hz, the 120 Hz waveform may be prevented from causing the input port to track the output port during a transient event on the bus at the output of the power regulator. Therefore, the steady-state of the input port may be maintained through faster dynamics, that is, through a response time that is faster than the period corresponding to the frequency of the transient signal. In some embodiments, the inner control loop may operate on the order of 100-200 Hz, or even potentially as high as 1 KHz or more, and the outer control loop may operate on the order of 10-20 Hz with high precision, maintaining the desired MPPT accuracy.

Other aspects of the present invention will become apparent with reference to the drawings and detailed description of the drawings that follow.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

Figure 1:
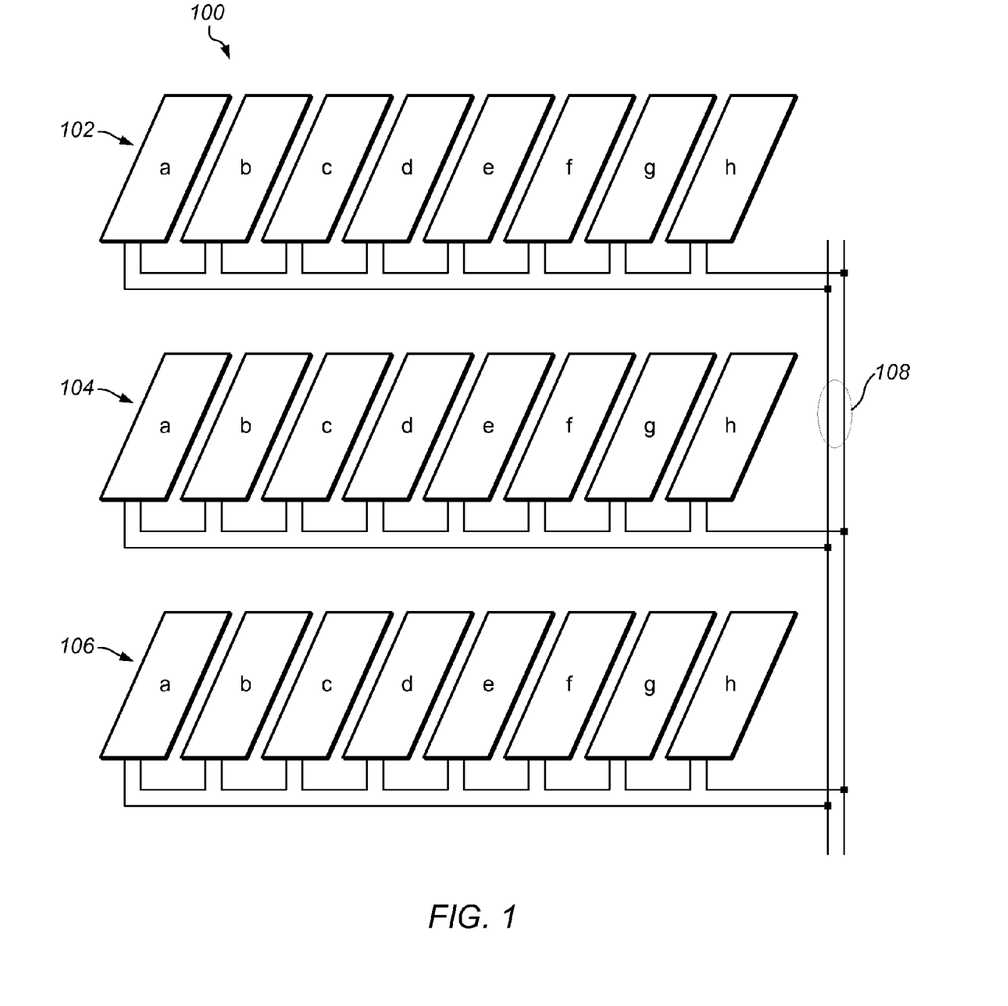
FIG. 1 shows an example diagram of a conventional series-string and parallel branch solar array configuration.

In solar array systems, many non-idealities may be mitigated by utilizing distributed Maximum Power Point Tracking (MPPT). Distributed MPPT usually includes insertion of a DC/DC converter or a similar power converter behind solar panels in the array, most commonly behind each and every solar panel in the array, to adapt the coupled solar panel's power transfer onto a high-voltage bus (typically a high-voltage DC bus) which connects the panels together via the DC/DC converters. A typical solar array 100 is shown in FIG. 1. Solar panel series-strings 102, 104, and 106 are coupled in parallel to bus 108, which may be a DC/DC bus. Each solar panel series-string includes solar panels a-h coupled in series to a respective bus, each of those respective buses coupling to bus 108 as shown to obtain parallel-coupled solar panel series-strings.

Figure 3:
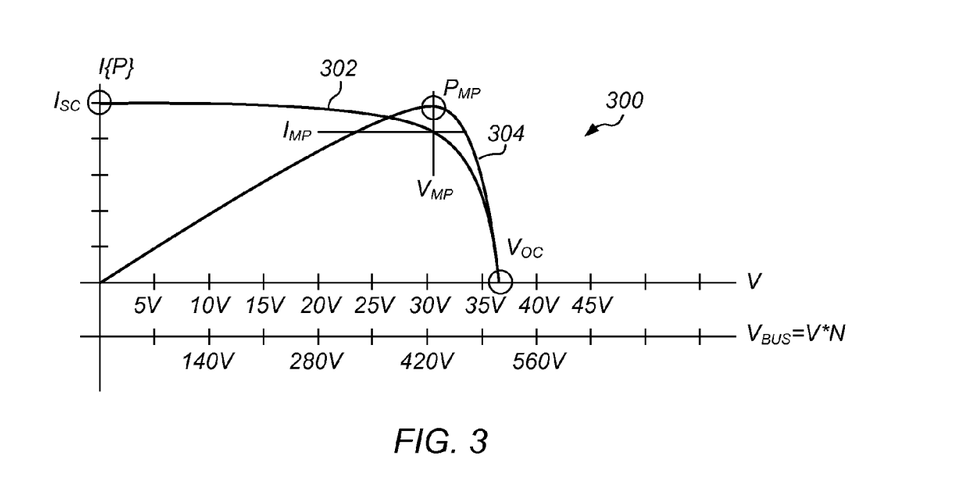
FIG. 3 shows an example V/I power curve for a series-string solar array configuration.

An example of the V/I (voltage/current) characteristic for each solar panel is shown in FIG. 3. As seen in FIG. 3, the V/I characteristic may be modeled as a current source in parallel with a multiplied shunt diode, where the current is proportional to the solar insolation levels, and the shunt diode is the result of the solar cell diode in each cell multiplied by the number of cells in series which make up that solar panel. Curve 302 represents the V/I curve, that is, the current I output by the solar panel (represented on the vertical axis) for a given output voltage V (represented on the horizontal axis). Curve 304 represents the power curve associated with V/I curve 302, showing the maximum power point $P_{MP}$, that is, the point at which the product of the current and voltage output by the solar panel is at its maximum. These values are indicated as $I_{MP}$ and $V_{MP}$, respectively, and $I_{MP}*V_{MP}=P_{MP}$. $V_{OC}$ indicates the open circuit voltage output by the solar panel, that is, the voltage output by the solar panel when not providing current to a load. Similarly, $I_{SC}$ indicates the short circuit current output by the solar panel, that is, the current output by the solar panel with its output terminals shorted together. $V_{BUS}$ indicates the total voltage that appears on the bus for N solar panels connected in the series-string.

Figure 4:
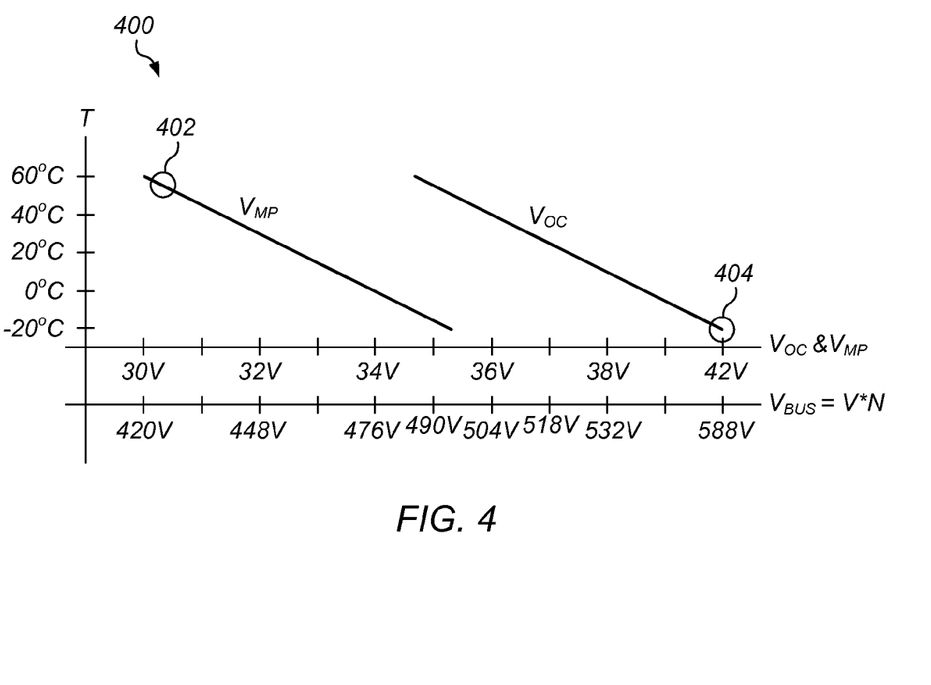
FIG. 4 shows an example $V_{OC}$ & $V_{MP}$ vs. temperature curve for a typical solar panel.

Turning now to FIG. 4, the open circuit voltage $V_{OC}$ of the solar panel may be set by the current—generated as a result of solar insolation—shunted by the series multiplied diode elements. As determined by the shunt diodes within the cell, this voltage may exhibit temperature variance similar to a silicon diode junction. The $V_{OC}$ for a solar panel may thus increase with decreasing temperature, and vice-versa, as indicated by the $V_{OC}$ curve shown in FIG. 4. Consequently, in order for the maximum bus voltage (maximum $V_{BUS}$) to comply with NEC (National Electrical Code) standards, the number of solar panels that may be connected in series at a given site needs to be determined based on the expected coldest temperature at that site. The bus specification usually limits the maximum value of $V_{BUS}$ to 600V in a US NEC compliant system. It should also be noted that at high temperatures, and while under load, the bus voltage may be substantially lower than the allowed operating level for the Bus. Point 402 on the $V_{MP}$ curve indicates the typical $V_{MP}$ condition, and point 404 on the $V_{OC}$ curve indicates a typical $V_{OC}$ condition.

Use of a properly designed respective adaptive DC/DC converter coupled to each solar panel in a solar panel array allows for modification of the curves shown in FIG. 4, under algorithmic control of the DC/DC converters. In order to calculate how many panels may be placed in series, the following equation may be used:

$$N=\text{Integer}(V_{BUS\text{-}max}/V_{OC\text{-}p}), \quad (1)$$

where $V_{BUS\text{-}max}$ is the maximum value of $V_{BUS}$, e.g. 600V when observing NEC standards, and $V_{OC\text{-}p}$ is the maximum value of $V_{OC}$ for any given panel utilized in the array, at the minimum site location temperature. For example, if $V_{BUS\text{-}max}$=600V, and $V_{OC\text{-}p}$=42V:

$$N=\text{Integer}(600V/42V)=\text{Integer}(14.28)=14. \quad (2)$$

Therefore, 14 panels of this type may normally be placed in series for a cold temperature $V_{BUS\text{-}OC}$=~14*42V=588V. According to the V/I curve 402, which corresponds to high temperature and operation at the maximum power point, in FIG. 4, $V_{MP}$ at 45° C. is close to 30.5V, resulting in a bus voltage value of $V_{BUS}$=~14*30.5V=427V under normal operating conditions for this example.

During normal operation, each panel may therefore contribute ~32V to the total bus voltage for the solar panel array string under. Assuming a case of shading, damage, or extreme mismatch, which may result in a given percentage of the solar panels in each string not providing normal power, the $V_{MP}$ bus voltage level may decrease by the amount that the given percentage of the solar panels fails to provide. For example, 20% of the solar panels in a given series-string failing to function normally may lead to a normal operating voltage of the series-string of $V_{BUS}$*~80%=358V, which represents a substantial drop. If other series-strings (of solar panels) maintain the bus voltage at $V_{BUS}$=448V under normal conditions, the given series-string may produce no power at all, and may come close to act as a shunt diode load on the high-voltage DC bus (e.g. bus 108 shown in FIG. 1).

In this example, to design a DC/DC converter unit to isolate the panel voltage from the Bus voltage to alleviate the problem, the desired operating points may be specified by determining the number of panels, and thus converter modules, to be connected in series. For $V_{BUS\text{-}MAX}$ (i.e. maximum bus voltage) conditions, each converter module may be limited to $V_{O\text{-}MAX}$=600V/14=42.85V, comparable to the panel $V_{OC}$, that is, $V_{OC\text{-}p}$. Furthermore, each module may be operated sufficiently below this level, to ensure that when a specified percentage (e.g. 15%) of the number of the solar panels are dysfunctional, the remaining modules may successfully boost up their voltage, staying below $V_{O\text{-}MAX}$, to compensate for lost voltage in that string. In the specific example provided, the preferred output operating voltage for each DC/DC converter module may thus be expressed as:

$$V_{O\text{-}nom}\leq(12/14*42.85V)\leq36.7V, \text{ and thus,} \quad (3)$$

$$V_{BUS}=36.7V*14=513.8V, \text{ normally.} \quad (4)$$

More generally, the nominal output voltage for each solar panel may be determined by dividing the number of functioning panels by the total number of panels in the series-string, and multiplying the result by the maximum output voltage of each solar panel. In this example, the bus voltage at the normal operating point may be improved by 15%, reducing the DC bus losses by ~32%. The resulting system may therefore become tolerant of two panels in each string becoming non-functional, fully or partially, while maintaining power from the other panels.

Maximum Power Point Tracking

Figure 2A:
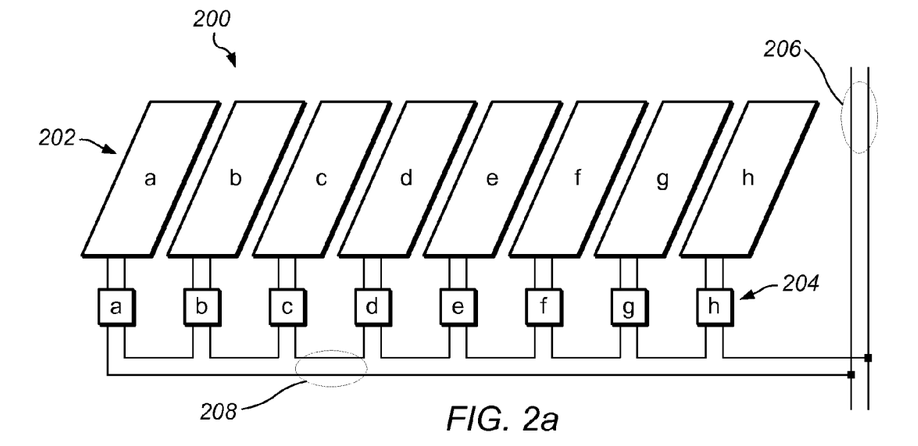
FIG. 2a shows an example of a series-string solar array configuration retrofitted with DC/DC converters attached to the solar panels.
Figure 5:
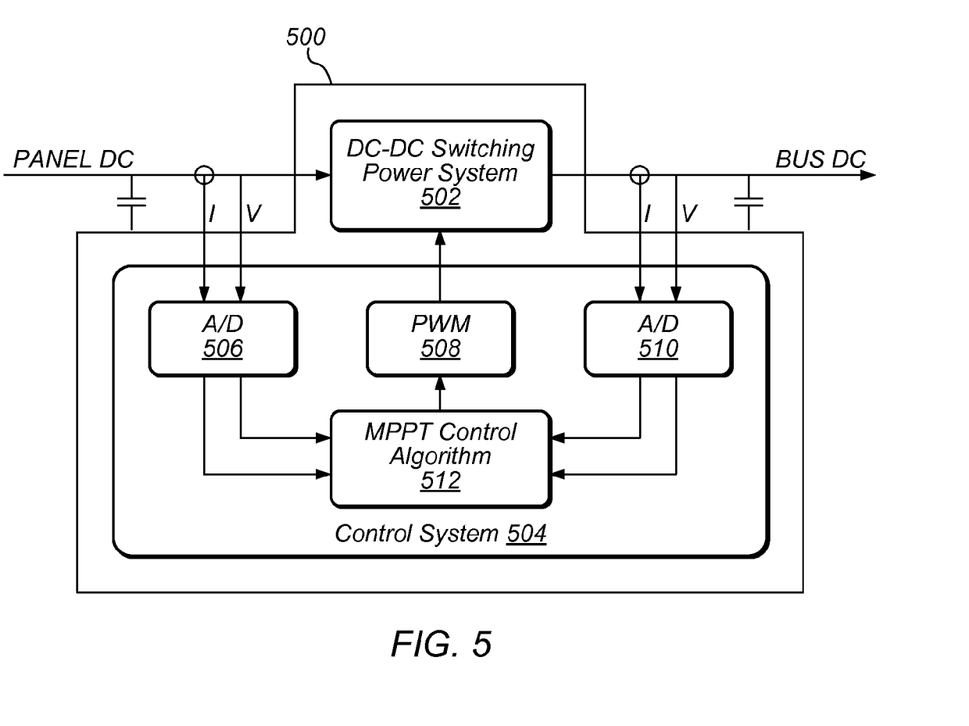
FIG. 5 shows an example Architecture for a direct MPPT controlled DC/DC Converter.

FIG. 2a shows one embodiment of a system 200 featuring a solar panel series-string 202, in which each of solar panels 202 a-h is coupled to a respective power converter unit 204 a-h. In this case, power converter units 204 a-h may each include a control unit, and a power converter that provides a voltage for bus 208, and is controlled by the control unit. For example, panel 202a is coupled to power converter and controller 204a, panel 202b is coupled to power converter and controller 204b, and so on. The respective outputs of the power converters and controllers 204 are then series coupled to high voltage DC bus 208, which may be parallel coupled to high voltage DC bus 206. For the sake of clarity, each power converter and controller will be referred to herein simply as a "converter unit", with the understanding that each converter unit may include a power converter, e.g. a DC/DC switching converter, and all associated control circuitry/unit, e.g. functional units to perform MPPT. Each of the attached converter units 204 may be designed to execute a control algorithm, which may exercise control over a switching power conversion stage. The internal structure of one embodiment of a typical converter unit 500 is shown in the block diagram of FIG. 5. Converter unit 500 may include a control system 504 implementing a single control loop to perform MPPT control of switching converter 502. The input voltage and input current from the solar panel may be sensed and sampled by A/D converter 506, and the output voltage and output current from switching converter 502 may be sensed and sampled by A/D converter 510. These sampled values may be processed using control algorithm 512 to calculate the power, and the duty-cycle of the switching signal provided to switching converter 502. For example, control algorithm 512 may be implemented in hardware, it may be implemented as instructions executed by a microcontroller/processor, or as a combination of both, and may use the sampled values directly to produce the required PWM signal 508 to achieve the conversion characteristics that maintain the solar panel at its maximum power point. It should also be noted, that analog implementation of control system 504 is possible and contemplated, in which case A/D converters 506 and 510 would not be required.

Figure 2B:
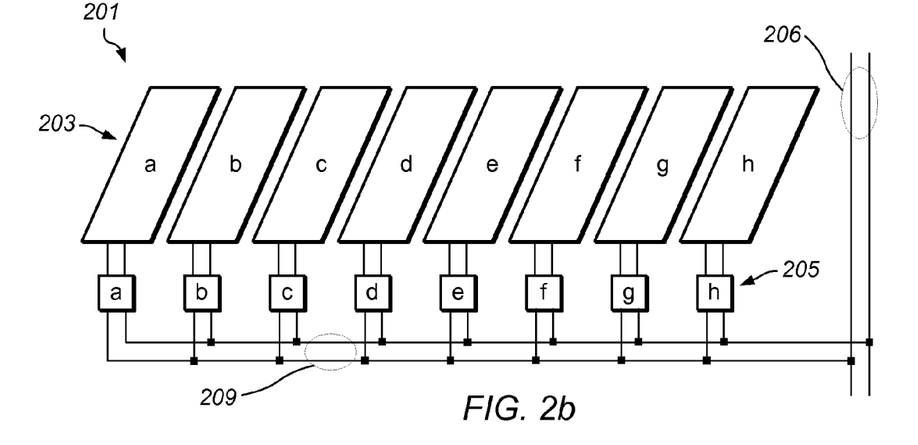
FIG. 2b shows an example of a parallel-string (parallel connected) solar array configuration with DC/DC converters attached to the solar panels.

In alternate embodiments, the respective outputs of the power converters and controllers 204 may be parallel coupled to high voltage DC bus 208, which may be coupled to high voltage DC bus 206. FIG. 2b shows one embodiment of a system 201 featuring a solar panel parallel-string 203, in which each of solar panels 203 a-h is coupled to a respective converter unit 205 *a-h*. Converter units 205 *a-h* may also each include a control unit and a power converter providing a voltage for bus 209, and controlled by the control unit. For example, panel 203*a* is coupled to converter unit 205*a*, panel 203*b* is coupled to converter unit 205*b*, and so on. The respective outputs of the power converters and controllers 205 are then parallel coupled to high voltage DC bus 209, which may be coupled to high voltage DC bus 206. Each of the attached converter units 205 may be designed to execute a control algorithm, which may exercise control over a switching power conversion stage. For a more detailed presentation, please refer to U.S. patent application Ser. No. 12/314,050, fully incorporated herein by reference. Possible embodiments of converter unit 205 are provided in FIG. 5 and FIG. 7.

Many algorithms currently exist for determining and maintaining MPPT operation in a system such as system 200, including Hill Climbing, Zero Derivative, Fuzzy Logic, etc. While such algorithms are applicable to these systems, each has its own advantages and disadvantages. The choice of algorithm type may be determined by a compromise of dynamic tracking characteristics, precision, and/or tracking bandwidth against desired results. Most algorithms may be considered equivalent of each other and equally applicable to a static system. Dynamic conditions typically occur during variable cloud shading and similar events, where the characteristics of the solar panel connected to the converter unit, as well as all of the other solar panels in the string may be affected rapidly. Under these conditions, converter units, such as converter unit 500 shown in FIG. 5, may not be able to provide a satisfactory response time. In one set of embodiments, a novel converter unit may implement a fast algorithm to track the dynamic conditions, and a slow algorithm to maintain accuracy and precision of the MPPT operating point.

Dual-Loop Fast Tracking MPPT:

Possible responses of the converter unit may be categorized as falling into one of two basic categories: a response to provide accurate MPPT, and a response to meet the needs for fast adaptive tracking. One solution may be derived from the unique characteristics of the solar panel V/I curve during most fast transients. A typical transient under consideration might be a cloud passing over the solar panels, producing a variable insolation level transient.

Figure 6:
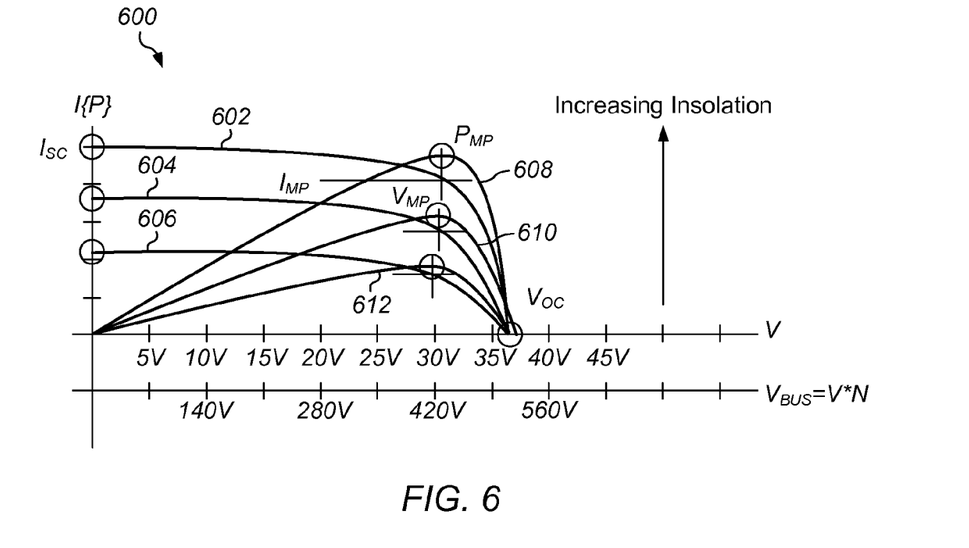
FIG. 6 shows an example V/I Curve for a typical solar panel at different insolation levels.

The graph 600 in FIG. 6 shows V/I curves for a given solar panel under three substantially different insolation levels. V/I curve 602 corresponds to a highest insolation level, V/I curve 604 corresponds to a lower insolation level, and V/I curve 606 corresponds to a lowest insolation level. Power curves 608, 610, and 612 in graph 600 are the power curves corresponding to V/I curves 602-606, respectively. As seen in graph 600, the current I generated by the solar panel is substantially reduced at lower insolation levels. In fact, it is typically the case that the current I is directly proportional to the insolation level. As a result, and as also seen in graph 600, the voltage at which MPPT is achieved remains substantially static, and varies very little over a transient of different insolation levels. In other words, the desired voltage $V_{MP}$ varies minimally, if at all, with respect to changing insolation levels. Consequently, early control systems for solar panels did not include a MPPT mechanism at all, but rather just operated the solar panel at a fixed voltage under all conditions, with the fixed voltage presumed to be near the desired MPPT voltage. However, such systems are not adaptive, and consequently cannot determine what the proper operating voltage for that given panel or string should be. Because of their lack of accuracy, the operation of such systems results in substantially reduced power transfer.

Figure 7:
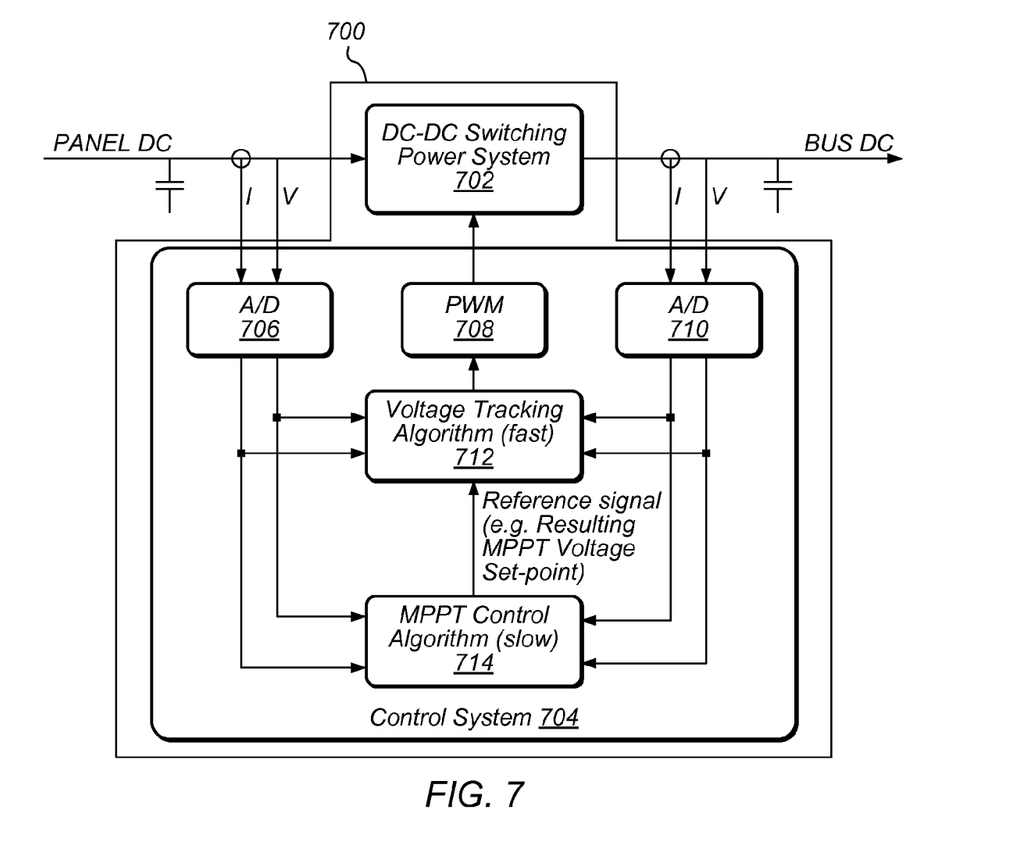
FIG. 7 shows one embodiment of a DC/DC converter controller that features an inner control loop regulating to $V_I$, and an outer MPPT control loop that sets the value for $V_I$.

One embodiment of an improved converter unit and method for achieving a fast response time together with accurate MPPT is shown in FIG. 7. Converter unit 700 may include a fast tracking inner control loop, which may be a fast tracking voltage regulating loop 712, and a slower MPPT tracking loop 714 utilized to set the "Reference" point for the inner control loop 712. In the embodiment shown, the Reference point is the reference voltage for the fast tracking inner control loop 712. The Reference point may be provided by MPPT loop 714 in the form of a control signal, whether analog or digital, to the inner voltage regulating loop 712, to determine what reference point (in this case reference voltage) the control system 704 should regulate to. The inner fast tracking loop 712 may directly control the DC/DC conversion duty-cycle of PWM control signal 708 for switching converter 702, and the outer MPPT loop 714 may continually monitor and average the power conditions to instruct the inner loop 712 what voltage value regulation should be performed to. Again, A/D converter 706 may be used to sense and sample the input voltage and current obtained from the solar panel, and A/D converter 710 may be used to sense and sample the voltage and current output by switching converter 702. However, in case of analog implementations, there is no need for A/D converters 706 and 710. Inner control loop 712 may be designed to monitor one or more of the input-ports (I and V received from the solar panel) and output-ports (I and V received from the output of power converter 702). Accordingly, converter unit 700 may include a total of four input ports, a first pair of input ports to receive input-port voltage and current from the solar panel, and a second pair of input ports to receive output-port voltage and current from power converter 702. It may also include an output port to provide the control signal to power converter 702 via PWM 708.

In one embodiment, fast tracking loop 712 may include a hardware PWM controller generating the PWM control signal 708 using analog and digital hardware functions, for a fully hardware-based control system. In another embodiment, fast tracking loop 712 include a microcontroller based system utilizing A/D and PWM peripherals implementing the fast tracking loop as a combination of hardware and firmware. Choices of embodiments including hardware and/or software implementations or a combination thereof may be based upon cost and performance criteria for the intended system while maintaining equivalence from an architectural perspective disclosed in at least FIG. 7.

MPPT algorithms typically use some form of dithering to determine a derivative of the Power vs. Voltage conditions, or to determine and maintain operation at the maximum power point. In converter unit 700, this dithering may now be performed by control system 704 dithering the reference signal (e.g. the resulting MPPT set-point, which may be an MPPT voltage set-point for regulating the input-port voltage, that is, the voltage input to A/D 706 and into converter 702) to the inner loop 712, rather than by directly modulating the duty-cycle of PWM signal 708. The advantages of the dual-loop structure in converter unit 700 include improved stability of the system, and very fast acquisition and tracking of the system during transients. Other advantages that may also be derived from the architectural partitioning into two control loops include current-mode operation of the inner Vin regulating control system, that is, current-mode operation of the inner control loop 712. Current-mode operation offers several advantages, including excellent tradeoff between stability and tracking speed, over-current protection and limiting, and automatic pulse-skipping during discontinuous-mode operation. Current-mode operation of fast tracking inner loop 712 may be particularly attractive, and easily enabled, when fast tracking inner loop 712 is implemented fully in hardware.

Automatic Pulse Skipping:

Since the efficiency of a power converter is related to the losses in the system compared to the power transferred through the system, it may be advantageous to reduce the losses for a given power level. Losses for a DC/DC converter can typically be lumped into several categories: transistor switching losses, transistor and diode resistive losses, core losses in the magnetics, resistive losses in the magnetics, control power used, and other miscellaneous resistive losses, including current sensing, etc.

In applications where the system is designed for high power levels, and the power is substantially reduced as a result of certain conditions, transistor switching losses may oftentimes become substantially dominant at the reduced, lower power levels. The control algorithm for the PWM controller may be modified to adjust the switching rate or timing at lower power levels to accommodate these conditions. By separating the input voltage regulating loop 712 from the MPPT loop 714, more complex PWM control may be introduced into the design of the inner loop 712. Because regulation in MPPT is in effect performed for optimizing power (specifically finding the maximum power point), a single loop may not be able to easily integrate dependent functions such as dynamic pulse skipping based on current. While it may be possible to implement such functionality in a single loop, it may prove overly difficult to do so, and the complexity and computational burden on microcontroller firmware may have to be substantially increased. Use of certain analog current-mode controllers for implementation of the inner voltage regulation loop 712 may allow natural implementation of low power pulse skipping for properly constructed designs.

DC/DC converter 702 may be designed to take advantage of the fact that the PWM duty-cycle is proportional to the power being transferred in the general case, and as the PWM duty-cycle drops below a predetermined level the on-time of the power output stage of converter 702 may be held constant while the off-time is increased, effectively reducing the switching rate and the related transistor switching losses. In addition, since below a certain lower predetermined duty-cycle value it may no longer be necessary or desirable to hold the on-time constant while decreasing the off-time, the rate may then be held and the duty-cycle again returned to conventional operation down to approaching 0%. This hybrid mode operation allows for optimization of the losses over a much broader range of power levels, especially in the crucial range where the input power is lower than normal. This feature may be implemented as a firmware controlled feature, or it may be implemented directly within analog and/or mixed-signal hardware peripherals to the microcontroller, or it may be implemented based upon a conventional analog current-mode architecture. Furthermore, when the power converters coupled to the solar panels are connected in parallel (e.g. refer to FIG. 2b, and U.S. patent application Ser. No. 12/314,050, fully incorporated herein by reference), fast tracking inner loop may be operated to adjust the output voltage of power converter 702 based on the Reference signal, as opposed to adjusting the input voltage of power converter 702.

Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A control system for controlling a power converter configured to couple to a solar panel and provide an output voltage to a voltage bus, the control system comprising:
    input ports configured to receive a plurality of parameters comprising:
        a first parameter indicative of an input current of the power converter provided by the solar panel;
        a second parameter indicative of an input voltage of the power converter provided by the solar panel;
        a third parameter indicative of an output voltage of the power converter; and
        a fourth parameter indicative of an output current of the power converter;
    an inner control loop configured to regulate one or more of the following, according to at least a reference value and at least one of the plurality of parameters:
        the input current of the power converter;
        the input voltage of the power converter;
        the output voltage of the power converter; and
        the output current of the power converter; and
    an outer control loop configured to perform Maximum-Power-Point-Tracking (MPPT) control of the power converter based on at least two of the plurality of parameters, and further configured to generate the reference value based on the plurality of parameters.

2. The control system of claim 1, wherein the inner control loop is an analog voltage regulation loop, and the reference value is a reference voltage set-point signal.

3. The control system of claim 1, wherein the outer loop is a digital MPPT loop.

4. The control system of claim 1, wherein the inner control loop is configured to operate in current-mode.

5. The control system of claim 1, wherein the reference value corresponds to a desired value of the input voltage of the power converter;
    wherein the outer control loop is configured to determine the desired value, and further configured to instruct the inner control loop, via analog signaling, to regulate the input voltage of the power converter to the desired value.

6. The control system of claim 1, wherein the outer control loop is configured to implement a three-point derivative plus peak detection and tracking MPPT algorithm.

7. The control system of claim 1, wherein the outer control loop is configured to implement an MPPT algorithm that incorporates dynamic dithering magnitude, dependent upon sensed dynamic and static conditions.

8. The control system of claim 1, wherein the inner control loop is a digital control regulation loop, and the reference value is a digital signal corresponding to a reference voltage set-point.

9. The control system of claim 1, wherein the inner control loop is configured to adjust a duty cycle value of a pulse width modulated (PWM) control signal to adjust the input voltage of the power converter.

10. The control system of claim 9, wherein the inner control loop is configured to hold an on-time of an output stage of the power converter constant while increasing an off-time of the output stage of the power converter when the duty cycle value of the PWM control signal drops below a specified level.

11. A control system for controlling a power converter configured to couple to a solar panel and provide an output voltage to a voltage bus, the control system comprising:
    a sensing circuit configured to receive a plurality of indicators comprising indications of an input current and input voltage of the power converter derived from the solar panel, and further comprising indications of an output voltage and output current of the power converter;

an inner control loop configured to adjust, according to a corresponding reference signal and at least one of the plurality of indicators, at least one of the following:
the input voltage of the power converter;
the input current of the power converter;
the output voltage of the power converter; and
the output current of the power converter;

an outer control loop configured to perform Maximum-Power-Point-Tracking (MPPT) control of the power converter based on the plurality of indicators, and further configured to generate the reference signal based on the plurality of indicators to maintain MPPT of the power converter.

12. The control system of claim 11, wherein the inner control loop is configured to operate at a bandwidth that is greater than a frequency of transients that affect the output voltage of the power converter.

13. The control system of claim 11, wherein the outer loop is a digital MPPT loop.

14. The control system of claim 11, wherein the inner control loop is configured to operate in current-mode.

15. The control system of claim 11, wherein the reference signal corresponds to a desired value of the input voltage of the power converter;
wherein the outer control loop is configured to determine the desired value, and further configured to instruct the inner control loop, via analog signaling, to adjust the input voltage of the power converter to the desired value.

16. The control system of claim 11, wherein the outer control loop is configured to implement an MPPT algorithm that incorporates dynamic dithering magnitude, dependent upon sensed dynamic and static conditions.

17. The control system of claim 11, wherein the inner control loop is a digital control regulation loop, and the reference signal is a digital value corresponding to a reference voltage set-point representative of one of:
a desired value of the input voltage of the power converter; and
a desired value of the output voltage of the power converter.

18. A method for controlling a power converter coupled to a solar panel and providing an output voltage to a voltage bus, the control system comprising:
determining a desired set-point according to a Maximum-PowerPoint-Tracking (MPPT) algorithm applied to the power converter via an outer control loop in the power converter, said determining also based on a plurality of indicators comprising:
input voltage of the power converter;
input current of the power converter;
output voltage of the power converter;
output current of the power converter; and
adjusting, via an inner control loop in the power converter and according to the desired set-point and at least one of the plurality of indicators, one or more of the following:
the input voltage of the power converter, said adjusting the input voltage causing regulation of the power converter to the desired set-point when the desired set-point corresponds to a desired value of the input voltage of the power converter; or
the output voltage of the power converter, said adjusting the output voltage causing regulation of the power converter to the desired set-point when the desired set-point corresponds to a desired value of the output voltage of the power converter.

19. The method of claim 18, wherein said adjusting according to the desired set-point and the at least one of the plurality of indicators comprises:
setting a duty-cycle value of a pulse width modulated (PWM) control signal; and
controlling the output voltage of the power converter using the PWM control signal.

20. The method of claim 18, wherein said adjusting according to the desired set-point and the at least one of the plurality of indicators is performed at a rate that is faster than a frequency of transients that affect the output of the voltage regulator.

21. A converter unit comprising:
a power converter having an input configured to couple to a solar panel and receive an input voltage and input current from the solar panel, and an output configured to couple to a voltage bus and provide a converter output voltage and a converter output current to the voltage bus; and
a control unit comprising:
input ports configured to receive a plurality of parameters comprising:
a first parameter indicative of an input current at the input of the power converter;
a second parameter indicative of an input voltage at the input of the power converter;
a third parameter indicative of the converter output voltage; and
a fourth parameter indicative of the converter output current;
an inner control loop configured to regulate, based on a reference value and at least one of the plurality of parameters, one or more of:
the input current at the input of the power converter;
the input voltage at the input of the power converter;
the converter output voltage; and
the converter output current; and
an outer control loop configured to perform Maximum-Power-Point-Tracking (MPPT) control of the power converter based on the plurality of parameters, and further configured to generate the reference value based on the plurality of parameters.

22. The converter unit of claim 21, wherein the power converter is a switching DC/DC converter.

23. The converter unit of claim 22, wherein the inner control loop is configured to regulate the input voltage at the input of the power converter by adjusting a duty cycle of a pulse width modulated (PWM) signal according to the reference value, wherein the PWM signal controls the converter output voltage.

* * * * *

UNITED STATES PATENT AND TRADEMARK OFFICE
CERTIFICATE OF CORRECTION

PATENT NO. : 8,975,783 B2  Page 1 of 1
APPLICATION NO. : 13/010280
DATED : March 10, 2015
INVENTOR(S) : Williams et al.

It is certified that error appears in the above-identified patent and that said Letters Patent is hereby corrected as shown below:

In the Claims:

Claim 18, Column 11, Line 47, please delete "PowerPoint" and substitute -- Power-Point --.

Signed and Sealed this
Thirtieth Day of June, 2015

Michelle K. Lee
*Director of the United States Patent and Trademark Office*